United States Patent
Tsuchiya et al.

(10) Patent No.: US 11,204,390 B2
(45) Date of Patent: Dec. 21, 2021

(54) BATTERY MONITORING CIRCUIT BOARD AND BATTERY MONITORING DEVICE

(71) Applicant: KEIHIN CORPORATION, Tokyo (JP)

(72) Inventors: Shingo Tsuchiya, Utsunomiya (JP); Katsuhiro Takahashi, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 140 days.

(21) Appl. No.: 16/654,570

(22) Filed: Oct. 16, 2019

(65) Prior Publication Data

US 2020/0124680 A1  Apr. 23, 2020

(30) Foreign Application Priority Data

Oct. 19, 2018  (JP) .............................. JP2018-197411

(51) Int. Cl.
*G01R 31/00* (2006.01)
*G01R 31/3842* (2019.01)
*H01M 10/42* (2006.01)
*H01M 10/48* (2006.01)

(52) U.S. Cl.
CPC ...... *G01R 31/3842* (2019.01); *H01M 10/425* (2013.01); *H01M 10/482* (2013.01); *H01M 2010/4271* (2013.01)

(58) Field of Classification Search
USPC ........................... 324/426–435; 320/151–152
See application file for complete search history.

(56) References Cited

U.S. PATENT DOCUMENTS

2016/0303977 A1* 10/2016 Kudo .................... B60L 3/0046
2018/0088179 A1*  3/2018 Ota ....................... G01R 31/396

FOREIGN PATENT DOCUMENTS

JP            2014082152 A       5/2014

* cited by examiner

*Primary Examiner* — Vincent Q Nguyen
(74) *Attorney, Agent, or Firm* — Cantor Colburn LLP

(57) ABSTRACT

Provided is a battery monitoring circuit board on which a plurality of battery monitoring ICs that are electrically connected to a plurality of battery cells and monitor a state of each of the battery cells are mounted. The battery monitoring circuit board includes a first mounting region on which a current consumption element that is electrically connectable to the battery monitoring IC is mounted. The first mounting region is provided for each of the battery monitoring ICs.

3 Claims, 3 Drawing Sheets

BATTERY MONITORING CIRCUIT BOARD AND BATTERY MONITORING DEVICE

CROSS REFERENCE TO RELATED APPLICATION

The present invention claims priority under 35 U.S.C. § 119 to Japanese Patent Application No. 2018-197411, filed on Oct. 19, 2018, the entire content of which is incorporated herein by reference.

BACKGROUND OF THE INVENTION

Field of the Invention

The present invention relates to a battery monitoring circuit board and a battery monitoring device.

Description of Related Art

Japanese Unexamined Patent Application, First Publication No. 2014-82152 discloses a battery voltage monitoring device provided with a plurality of battery monitoring ICs that are electrically connected to a plurality of battery cells and monitor the state of each of the battery cells.

In the battery voltage monitoring device, in order to suppress a variation in current consumption between the battery monitoring ICs, pull-down resistors are connected to the battery monitoring ICs such that current consumption in the battery monitoring ICs is made uniform.

Incidentally, since the number of battery cells installed in a hybrid electric vehicle (HEV) or an electric vehicle (EV) (hereinafter, referred to as "number of battery cells") depends on the size of a vehicle body or the like, the number of battery cells is different for each vehicle. Therefore, in a circuit board (battery monitoring circuit board) on which battery monitoring ICs are mounted, the number of mounted battery monitoring ICs is different for each vehicle. In addition, since the number of battery monitoring ICs or the number of cells connected to the battery monitoring ICs is different for each vehicle, it is a matter of course that current consumption in each battery monitoring IC is different for each vehicle. Therefore, the number of pull-down resistors mounted on a battery monitoring circuit board is different for each vehicle and thus it is necessary to design and manufacture a battery control board dedicated for a vehicle, for each vehicle. Accordingly, there is an increase in manufacturing cost.

The present invention has been made in consideration of the above-described problem and an object thereof is to provide a battery monitoring circuit board and a battery monitoring device with which it is possible to suppress the cost of manufacturing a battery monitoring circuit board.

SUMMARY OF THE INVENTION

According to an aspect of the present invention, there is provided a battery monitoring circuit board on which a plurality of battery monitoring ICs that are electrically connected to a plurality of battery cells and monitor a state of each of the battery cells are mounted. The battery monitoring circuit board includes a first mounting region, on which a current consumption element that is electrically connectable to the battery monitoring IC is mounted. The first mounting region is provided for each of the battery monitoring ICs.

The battery monitoring circuit board according to the aspect of the invention may further include a ground pattern and each first mounting region may be provided between a second mounting region on which each battery monitoring IC is mounted and the ground pattern.

In the battery monitoring circuit board according to the aspect of the invention, each first mounting region may be provided between a land pattern of an input-output port of each battery monitoring IC and the ground pattern.

According to another aspect of the invention, there is provided a battery monitoring device including the above-described battery monitoring circuit board and the plurality of battery monitoring ICs mounted on the battery monitoring circuit board, in which the plurality of battery monitoring ICs include a first battery monitoring IC and a second battery monitoring IC, the number of battery cells electrically connected to the first battery monitoring IC and the number of battery cells electrically connected to the second battery monitoring IC are different from each other, and the current consumption element is mounted while being connected to at least any one of the first battery monitoring IC and the second battery monitoring IC such that current consumption in the first battery monitoring IC and current consumption in the second battery monitoring IC are approximately equalized.

In the battery monitoring device according to the other aspect of the invention, the number of battery cells electrically connected to the first battery monitoring IC may be larger than the number of battery cells electrically connected to the second battery monitoring IC, and the current consumption element may be mounted while being connected only to the second battery monitoring IC.

As described above, according to the aspects of the present invention, it is possible to suppress the cost of manufacturing a battery monitoring circuit board.

DETAILED DESCRIPTION OF THE INVENTION

Hereinafter, a battery monitoring circuit board according to an embodiment of the present invention will be described with reference to drawings.

Figure 1:
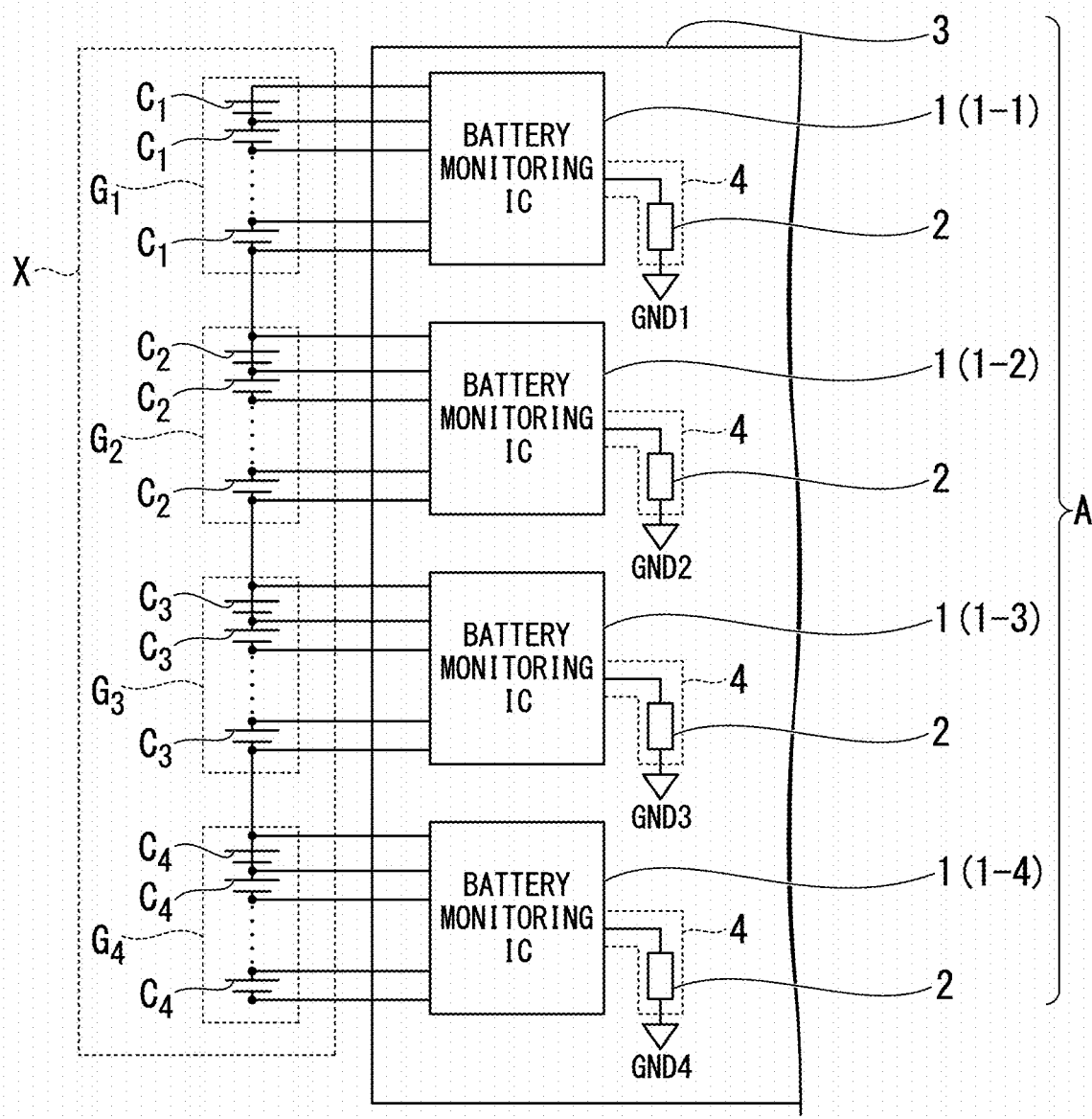
FIG. 1 is a view illustrating an example of a schematic configuration of a battery monitoring device A configured using a battery monitoring circuit board according to an embodiment of the present invention.

FIG. 1 is a view illustrating an example of a schematic configuration of a battery monitoring device A configured using a battery monitoring circuit board according to the embodiment of the present invention.

The battery monitoring device A according to the embodiment of the present invention is a device that measures the voltage of an assembled battery X (DC battery) and monitors the voltage thereof as shown in FIG. 1.

The assembled battery X is, for example, a battery installed in an electric vehicle or a hybrid electric vehicle and is a secondary battery such as a lithium ion battery or a nickel hydrogen battery. The assembled battery X is provided with a plurality of battery cell groups G1 to Gn (n is integer of 2 or more) connected in series. In addition, a plurality of battery cells C are connected in series in each of the battery cell groups G1 to Gn. Here, since the number of battery cells C in each of the battery cell groups G1 to Gn (hereinafter, also referred to as "number of battery cells") depends on the size of a vehicle body or the like of the vehicle in which the assembled battery X is installed, the number of battery cells may be different for each vehicle. Note that, although a case where the number of the battery cell groups G1 to Gn is four (n=4) will be described in the present embodiment, the number of battery cell groups G1 to Gn is not limited to four. The number (n) of the battery cell groups G1 to Gn depends on the size of the vehicle body or the like of the vehicle in which the assembled battery X is installed and may be different for each vehicle.

In each of the battery cell groups G1 to G4, a positive electrode terminal of a battery cell at an uppermost position (uppermost cell) is a positive electrode terminal (one output terminal) of a battery cell group 10 and a negative electrode terminal of a battery cell at a lowermost position (lowermost cell) is a negative electrode terminal (other output terminal) of the battery cell group 10. In addition, the positive electrode terminal and the negative electrode terminal of each of the battery cell groups G1 to G4 are connected to the battery monitoring device A.

The battery monitoring device A is provided with a circuit that monitors the assembled battery X based on the output voltage of the assembled battery X. Hereinafter, a schematic configuration of the battery monitoring device A according to the present embodiment will be described.

As shown in FIG. 1, the battery monitoring device A is provided with a plurality of battery monitoring ICs 1 (1-1 to 1-4), current consumption elements 2, and a battery monitoring circuit board 3.

The plurality of battery monitoring ICs 1 (1-1 to 1-4) are ICs (integrated circuits) that are electrically connected to the plurality of battery cells C and monitor the state of each of the battery cells C. The battery monitoring ICs 1 are provided to correspond to the battery cell groups G1 to G4.

For example, the battery monitoring IC 1-1 is provided to correspond to the battery cell group G1 and is provided with a plurality of pairs of input terminals which respectively correspond to output terminals (positive terminals and negative terminals) of the battery cells C in the battery cell group G1 (hereinafter, referred to as "battery cells C1"). In addition, the output terminals (positive terminals and negative terminals) of the battery cells C1 and the plurality of pairs of input terminals of the battery monitoring IC 1-1 are respectively connected to each other via connecting lines. Accordingly, opposite ends of each battery cell C1 and the battery monitoring IC 1-1 are electrically connected to each other. In addition, the battery monitoring IC 1-1 measures a potential difference between the opposite ends of each battery cell C1 (hereinafter, referred to as "end-to-end voltage") to monitor the state of each of the battery cells C1. Note that, the battery monitoring IC 1-1 may be operated by receiving power supplied from each battery cell C1.

For example, the battery monitoring IC 1-2 is provided to correspond to the battery cell group G2 and is provided with a plurality of pairs of input terminals which respectively correspond to output terminals (positive terminals and negative terminals) of the battery cells C in the battery cell group G2 (hereinafter, referred to as "battery cells C2"). In addition, the output terminals (positive terminals and negative terminals) of the battery cells C2 and the plurality of pairs of input terminals of the battery monitoring IC 1-2 are respectively connected to each other via connecting lines. Accordingly, opposite ends of each battery cell C2 and the battery monitoring IC 1-2 are electrically connected to each other. In addition, the battery monitoring IC 1-2 measures a potential difference between the opposite ends of each battery cell C2 (hereinafter, referred to as "end-to-end voltage") to monitor the state of each of the battery cells C2. Note that, the battery monitoring IC 1-2 may be operated by receiving power supplied from each battery cell C2.

For example, the battery monitoring IC 1-3 is provided to correspond to the battery cell group G3 and is provided with a plurality of pairs of input terminals which respectively correspond to output terminals (positive terminals and negative terminals) of the battery cells C in the battery cell group G3 (hereinafter, referred to as "battery cells C3"). In addition, the output terminals (positive terminals and negative terminals) of the battery cells C3 and the plurality of pairs of input terminals of the battery monitoring IC 1-3 are respectively connected to each other via connecting lines. Accordingly, opposite ends of each battery cell C3 and the battery monitoring IC 1-3 are electrically connected to each other. In addition, the battery monitoring IC 1-3 measures a potential difference between the opposite ends of each battery cell C3 (hereinafter, referred to as "end-to-end voltage") to monitor the state of each of the battery cells C3. Note that, the battery monitoring IC 1-3 may be operated by receiving power supplied from each battery cell C3.

For example, the battery monitoring IC 1-4 is provided to correspond to the battery cell group G4 and is provided with a plurality of pairs of input terminals which respectively correspond to output terminals (positive terminals and negative terminals) of the battery cells C in the battery cell group G4 (hereinafter, referred to as "battery cells C4"). In addition, the output terminals (positive terminals and negative terminals) of the battery cells C4 and the plurality of pairs of input terminals of the battery monitoring IC 1-4 are respectively connected to each other via connecting lines. Accordingly, opposite ends of each battery cell C4 and the battery monitoring IC 1-4 are electrically connected to each other. In addition, the battery monitoring IC 1-4 measures a potential difference between the opposite ends of each battery cell C4 (hereinafter, referred to as "end-to-end voltage") to monitor the state of each of the battery cells C4. Note that, the battery monitoring IC 1-4 may be operated by receiving power supplied from each battery cell C4.

The current consumption elements 2 are electrically connectable to the battery monitoring ICs 1 (1-1 to 1-4) and are for suppressing a variation in current consumption between the battery monitoring ICs 1 such that current consumption in the battery monitoring ICs 1 is made uniform. Therefore, the current consumption elements 2 may be connected to all of the battery monitoring ICs 1-1 to 1-4 and may be connected to at least any of the battery monitoring ICs 1-1 to 1-4. In addition, if current consumption in the battery monitoring ICs 1-1 to 1-4 is uniform without the current consumption elements 2 being connected to the battery monitoring ICs 1-1 to 1-4, the current consumption elements 2 may not be connected to any of the battery monitoring ICs 1-1 to 1-4. However, the battery monitoring circuit board 3 is provided with first mounting regions 4 on which the current consumption elements 2, which are electrically connectable to the battery monitoring ICs, are mounted. That is, the battery monitoring circuit board 3 is provided with the first mounting region 4 for mounting the current consumption element 2 for each of the battery monitoring ICs 1-1 to 1-4 such that the current consumption elements 2 can be connected to all of the battery monitoring ICs 1-1 to 1-4.

The current consumption element 2 is, for example, a resistor and is electrically connected between one input-output port of the battery monitoring IC 1 and a ground (for example, ground pattern GP formed on battery monitoring circuit board 3). Note that, in the present embodiment, the grounds of the battery monitoring ICs 1-1 to 1-4 are not the same and are different from each other. Therefore, in the present embodiment, the current consumption element 2 of the battery monitoring IC 1-1 is electrically connected between one input-output port of the battery monitoring IC 1-1 and a ground GND1 (ground pattern GP1). The current consumption element 2 of the battery monitoring IC 1-2 is electrically connected between one input-output port of the battery monitoring IC 1-2 and a ground GND2 (ground pattern GP2). The current consumption element 2 of the battery monitoring IC 1-3 is electrically connected between one input-output port of the battery monitoring IC 1-3 and a ground GND3 (ground pattern GP3). The current consumption element 2 of the battery monitoring IC 1-1 is electrically connected between one input-output port of the battery monitoring IC 1-4 and a ground GND4 (ground pattern GP4).

Hereinafter, the current consumption elements 2 according to the present embodiment will be described by using FIG. 2. For example, it will be assumed that the number of battery cells in each of the battery cell group G1 and the battery cell group G4 from among the battery cell groups G1 to G4 is eighteen and the number of battery cells in each of the battery cell group G2 and the battery cell group G3 is twelve. In this case, each of the battery monitoring IC 1-1 and the battery monitoring IC 1-4 is electrically connected to eighteen battery cells C. Meanwhile, each of the battery monitoring IC 1-2 and the battery monitoring IC 1-3 is electrically connected to twelve battery cells C. As described above, in an example shown in FIG. 2, the number of battery cells electrically connected to the battery monitoring IC 1-1 and the battery monitoring IC 1-4 is larger than the number of battery cells electrically connected to the battery monitoring IC 1-2 and the battery monitoring IC 1-3. Note that, in the following description, the battery monitoring IC 1-1 and the battery monitoring IC 1-4 will be referred to as "first battery monitoring ICs" and the battery monitoring IC 1-2 and the battery monitoring IC 1-3 will be referred to as "second battery monitoring ICs" in some cases.

Figure 2:
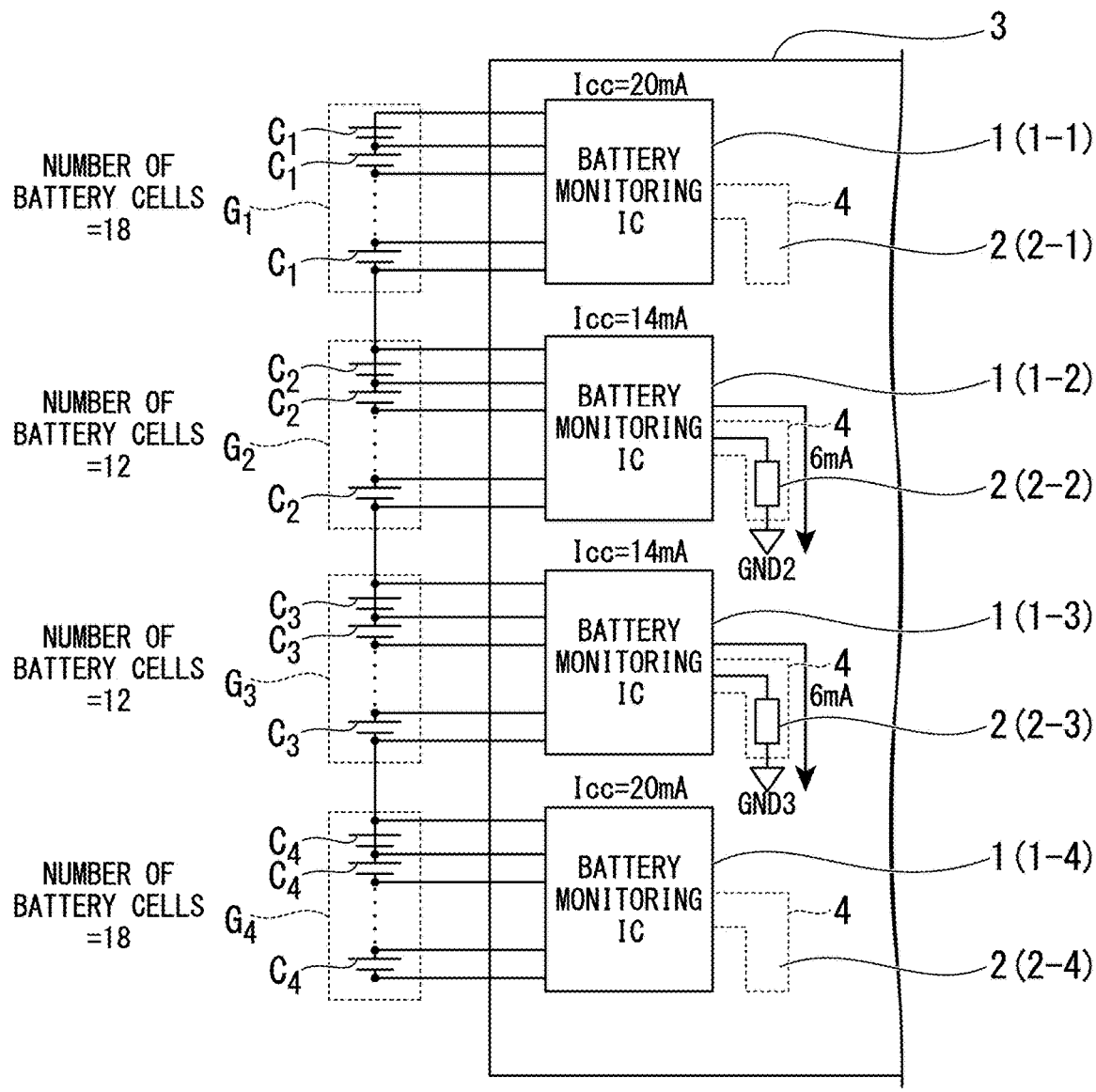
FIG. 2 is a view for describing a current consumption element 2 according to the embodiment.

As shown in FIG. 2, in a case where any battery monitoring IC 1 from among the battery monitoring ICs 1-1 to 1-4 is different in the number of battery cells connected thereto, that is, in a case where the first battery monitoring ICs and the second battery monitoring ICs are provided, the current consumption elements 2 are connected only to the second battery monitoring ICs, to which a smaller number of battery cells are connected, such that current consumption in the first battery monitoring ICs and current consumption in the second battery monitoring ICs are approximately equalized.

More specifically, it will be assumed that current consumption Icc in the first battery monitoring IC to which eighteen battery cells C are connected is 20 mA. Meanwhile, twelve battery cells C are connected to the second battery monitoring IC and the number of battery cells electrically connected to the second battery monitoring IC is smaller than the number of battery cells electrically connected to the first battery monitoring IC. Therefore, current consumption Icc in the second battery monitoring IC is 14 mA which is smaller than the current consumption in the first battery monitoring IC. In this case, the current consumption element 2 through which a current of 6 mA flows is provided between one input-output port of the battery monitoring IC 1-2, which is the second battery monitoring IC, and the ground (GND2). Similarly, the current consumption element 2 through which a current of 6 mA flows is provided between one input-output port of the battery monitoring IC 1-3, which is the second battery monitoring IC, and the ground (GND3).

Accordingly, with a current consumed flowing through each of the current consumption elements 2 connected to the second battery monitoring ICs, it is possible to increase, in accordance with current consumption in the first battery monitoring ICs where current consumption is greatest, current consumption in the other battery monitoring ICs (second battery monitoring ICs) with respect to a variation in current consumption between the battery monitoring ICs 1-1 to 1-4 and thus current consumption is approximately equalized without a variation. In this manner, by selecting, in accordance with the number of battery cells connected to each battery monitoring IC 1 installed on the battery monitoring circuit board 3, the battery monitoring IC 1 to which the current consumption element 2 is to be connected and by mounting the current consumption element 2 such that the current consumption element 2 is electrically connected to the selected battery monitoring IC 1, it is possible to suppress a variation in current consumption between the battery monitoring ICs 1-1 to 1-4.

The battery monitoring circuit board 3 is a board on which the battery monitoring ICs 1-1 to 1-4 and the current consumption elements 2 are mounted and is, for example, a printed board. Note that, the "battery monitoring circuit board" in the present invention may be a board (so-called printed wired board (PWB)) before the mounting of the battery monitoring ICs 1-1 to 1-4 and the current consumption elements 2 and may be a board (so-called printed circuit board (PCB)) after the mounting (on-board mounting) of the battery monitoring ICs 1-1 to 1-4 and the current consumption elements 2.

Figure 3:
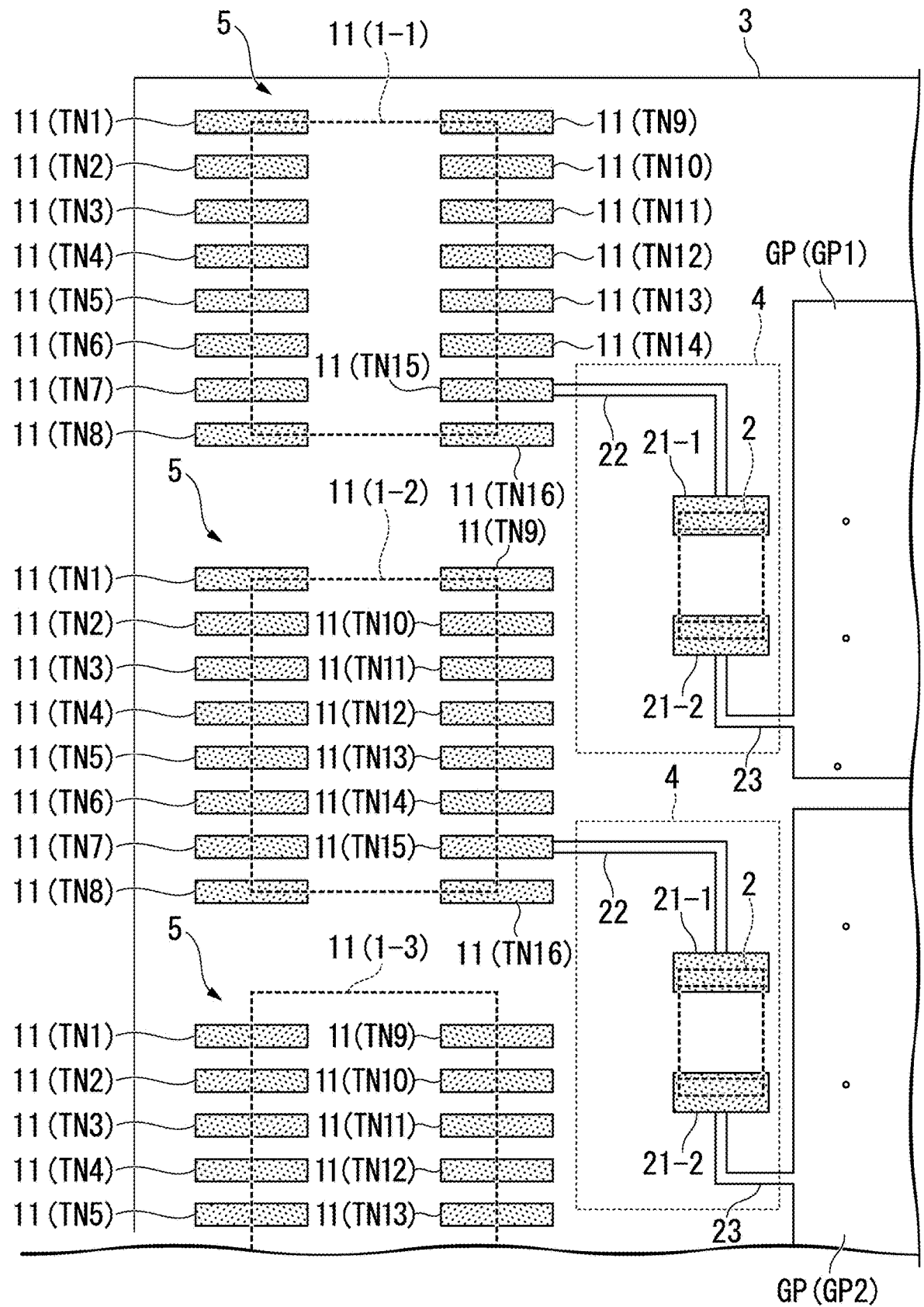
FIG. 3 is a schematic plan view of a battery monitoring circuit board 3 according to the embodiment.

Hereinafter, the battery monitoring circuit board 3 according to the present embodiment will be specifically described. FIG. 3 is a schematic plan view of the battery monitoring circuit board 3 according to the present embodiment.

The battery monitoring circuit board 3 is provided with the first mounting regions 4 and second mounting regions 5.

The first mounting region 4 is a region for mounting the current consumption element 2 on the battery monitoring circuit board 3 and is provided for each of the battery monitoring ICs 1-1 to 1-4. Accordingly, even in a case where which battery monitoring IC 1 is to be connected to the current consumption element 2 from among the battery monitoring ICs 1-1 to 1-4 is changed, it is possible to electrically connect the current consumption element 2 to the battery monitoring IC 1 as a connection destination after the change without changing the battery monitoring circuit board 3. That is, it is possible to randomly select which battery monitoring IC 1 is to be electrically connected to the current consumption element 2 on one battery monitoring circuit board 3 and to mount the current consumption element 2 on the selected battery monitoring IC 1. Note that, in the present embodiment, one first mounting region 4 is provided for each of the battery monitoring ICs 1-1 to 1-4. However, the present invention is not limited to this configuration and a plurality of the first mounting regions 4 may be provided for each of the battery monitoring ICs 1-1 to 1-4.

The second mounting region 5 is a region for mounting the battery monitoring IC 1 on the battery monitoring circuit board 3 and is provided for each of the battery monitoring ICs 1. For example, the second mounting region 5 is provided with a plurality of land patterns 11 for soldering a plurality of terminals of the battery monitoring IC 1 to the battery monitoring circuit board 3. Note that, although an example in FIG. 3 shows a case where the battery monitoring IC 1 includes sixteen terminals, the number of terminals of the battery monitoring IC 1 in the present invention is not particularly limited.

Next, an example of the first mounting region 4 according to the present embodiment will be specifically described.

The first mounting region 4 is provided with land patterns 21 and wiring patterns 22 and 23. The land patterns 21 are land patterns for mounting the current consumption element 2 on the battery monitoring circuit board 3. In a case where the current consumption element 2 is a resistor, the first mounting region 4 is provided with, as the land patterns 21, a land pattern 21-1 for mounting one end of the current consumption element 2 on the battery monitoring circuit board 3 and a land pattern 21-2 for mounting the other end of the current consumption element 2 on the battery monitoring circuit board 3.

The wiring pattern 22 is a pattern for electrically connecting the one end of the current consumption element 2 to an input-output port of the battery monitoring IC 1. One end of the wiring pattern 22 in the present embodiment is electrically connected to the land pattern 11 of a terminal of which a terminal number TN is 15 and the other end of the wiring pattern 22 is electrically connected to the land pattern 21-1.

The wiring pattern 23 is a pattern for electrically connecting the other end of the current consumption element 2 to the ground pattern GP formed on the battery monitoring circuit board 3. Specifically, one end of the wiring pattern 23 is electrically connected to the land pattern 21-2 and the other end of the wiring pattern 23 is electrically connected to the ground pattern GE Note that, in the present embodiment, since the grounds of the battery monitoring ICs 1-1 to 1-4 are different from each other, the other end of the wiring pattern 23 of the battery monitoring IC 1-1 is electrically connected to the ground pattern GP1 and the other end of the wiring pattern 23 of the battery monitoring IC 1-2 is electrically connected to the ground pattern GP2 which is different from the ground pattern GP1, as shown in FIG. 3.

As described above, the battery monitoring circuit board 3 according to the present embodiment is a circuit board on which the plurality of battery monitoring ICs 1 that are electrically connected to the plurality of battery cells C and monitor the state of each of the battery cells C are mounted. The battery monitoring circuit board 3 includes the first mounting region 4, on which the current consumption element 2 that is electrically connectable to the battery monitoring IC 1 is mounted. In addition, the first mounting region 4 is provided for each of the battery monitoring ICs 1.

According to this configuration, it is possible to mount the current consumption elements 2 suppressing a variation in current consumption between the battery monitoring ICs 1 and it is possible to use the same battery monitoring circuit board 3 even in a case where the number of battery monitoring ICs or the number of battery cells connected to the battery monitoring ICs is changed or a case where the types of the battery monitoring ICs are changed (case where variation in current consumption is changed). That is, even in a case where the number of battery monitoring ICs mounted on the battery monitoring circuit board 3, the types of battery monitoring ICs, or the number of battery cells connected to the battery monitoring ICs differs depending on the size or the like of a vehicle, it is possible to mount the current consumption elements 2 in accordance with the number of battery cells connected to the mounted battery monitoring ICs 1 without changing the design of the battery monitoring circuit board 3. Accordingly, it is possible to achieve commonization of the battery monitoring circuit board 3. Therefore, it is possible to suppress the cost of manufacturing a battery monitoring circuit board.

In addition, in the above-described embodiment, the battery monitoring circuit board 3 may include the ground pattern GP. In addition, the first mounting region 4 may be provided in each of spaces between the second mounting regions 5 on which the battery monitoring ICs 1 are respectively mounted and the ground pattern GP. For example, the first mounting region 4 may be provided in each of spaces between the land patterns 11 of respective input-output ports of the battery monitoring ICs 1 and the ground pattern GP.

According to this configuration, it is possible to achieve commonization of the battery monitoring circuit board 3 in which a resistor is adopted as the current consumption element 2 and a variation in current consumption between the battery monitoring ICs 1 can be suppressed by means of the resistor.

In addition, the battery monitoring device A in the above-described embodiment includes the battery monitoring circuit board 3 and the plurality of battery monitoring ICs 1 mounted on the battery monitoring circuit board 3. In addition, the plurality of battery monitoring ICs 1 include at least the first battery monitoring IC and the second battery monitoring IC. As described above, the number of battery cells electrically connected to the first battery monitoring IC and the number of battery cells electrically connected to the second battery monitoring IC are different from each other. In such a case, the current consumption element 2 is mounted while being connected to at least any of the first battery monitoring IC and the second battery monitoring IC such that current consumption in the first battery monitoring IC and current consumption in the second battery monitoring IC are approximately equalized.

According to this configuration, even in a case where there is a variation in current consumption between the first battery monitoring IC and the second battery monitoring IC due to the difference in the number of battery cells connected thereto, it is possible to suppress the variation in current consumption by means of the current consumption element 2.

In addition, in the battery monitoring device A in the above-described embodiment, the current consumption element 2 may be mounted while being connected only to the second battery monitoring IC in a case where the number of battery cells electrically connected to the first battery monitoring IC is larger than the number of battery cells electrically connected to the second battery monitoring IC.

According to this configuration, with a current consumed flowing through each of the current consumption element 2 connected to the second battery monitoring IC, it is possible to increase, in accordance with current consumption in the first battery monitoring IC where current consumption is greatest, current consumption in the second battery monitoring IC with respect to a variation in current consumption between the battery monitoring ICs 1 and thus the variation in current consumption can be suppressed.

Hereinabove, the embodiment of the invention has been described in detail with reference to the drawings. However, the specific configuration thereof is not limited to the above embodiment and designs and the like not departing from the scope of the invention can also be included.

According to the present invention, it is possible to suppress the cost of manufacturing a battery monitoring circuit board.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

A battery monitoring device
C battery cell
1 battery monitoring IC
2 current consumption element
3 battery monitoring circuit board
4 first mounting region
5 second mounting region
11 land pattern
GP ground pattern

What is claimed is:

1. A battery monitoring circuit board on which a plurality of battery monitoring ICs that are electrically connected to a plurality of battery cells and monitor a state of each of the battery cells are mounted, the battery monitoring circuit board comprising:
a ground pattern;
a first mounting region, on which a current consumption element that is electrically connected between the battery monitoring IC and the ground pattern is mounted;
a second mounting region on which each battery monitoring IC is mounted, the second mounting region including first land patterns that are disposed on sides of the battery monitoring IC and are electrically connected between the battery monitoring IC and the battery cell and between the battery monitoring IC and the current consumption element,
wherein the first mounting region is provided for each of the battery monitoring ICs, and
wherein the first mounting region includes
a second land pattern that is on the current consumption element and is electrically connected between the battery monitoring IC and the current consumption element, and
a third land pattern that is on the current consumption element and is electrically connected between the current consumption element and the ground pattern.

2. A battery monitoring device comprising:
the battery monitoring circuit board according to claim 1; and
the plurality of battery monitoring ICs mounted on the battery monitoring circuit board,
wherein the plurality of battery monitoring ICs include a first battery monitoring IC and a second battery monitoring IC,
wherein the number of battery cells electrically connected to the first battery monitoring IC and the number of battery cells electrically connected to the second battery monitoring IC are different from each other, and
wherein the current consumption element is mounted while being connected to at least any one of the first battery monitoring IC and the second battery monitoring IC such that current consumption in the first battery monitoring IC and current consumption in the second battery monitoring IC are approximately equalized.

3. The battery monitoring device according to claim 2, wherein the number of battery cells electrically connected to the first battery monitoring IC is larger than the number of battery cells electrically connected to the second battery monitoring IC, and
wherein the current consumption element is mounted while being connected only to the second battery monitoring IC.

* * * * *